(12) United States Patent
Popovich et al.

(10) Patent No.: US 9,075,184 B2
(45) Date of Patent: Jul. 7, 2015

(54) COMPACT EDGE ILLUMINATED DIFFRACTIVE DISPLAY

(76) Inventors: Milan Momcilo Popovich, Leicester (GB); Jonathan David Waldern, Los Altos Hills, CA (US)

(*) Notice: Subject to any disclaimer, the term of this patent is extended or adjusted under 35 U.S.C. 154(b) by 313 days.

(21) Appl. No.: 13/506,389

(22) Filed: Apr. 17, 2012

(65) Prior Publication Data
US 2013/0271731 A1 Oct. 17, 2013

(51) Int. Cl.
| | |
|---|---|
| G03B 21/00 | (2006.01) |
| G03H 1/10 | (2006.01) |
| G02B 6/02 | (2006.01) |
| H01L 33/10 | (2010.01) |
| G01J 3/18 | (2006.01) |
| G03F 7/20 | (2006.01) |
| H04N 9/31 | (2006.01) |

(52) U.S. Cl.
CPC ............ *G02B 6/02076* (2013.01); *H01L 33/10* (2013.01); *G01J 3/1895* (2013.01); *G03F 7/70316* (2013.01); *G03B 21/005* (2013.01); *H04N 9/315* (2013.01); *H04N 9/3173* (2013.01)

(58) Field of Classification Search
CPC .............. G02B 2006/02076; G02B 6/02076; H04B 10/2519; G02F 1/332; H01L 33/10; G01J 3/1895; G03F 7/70316
USPC ................ 353/31; 348/739; 359/10; 349/201
See application file for complete search history.

(56) References Cited

U.S. PATENT DOCUMENTS

| | | |
|---|---|---|
| 5,410,370 A | 4/1995 | Janssen |
| 5,416,514 A | 5/1995 | Janssen |
| 5,751,452 A | 5/1998 | Tanaka |
| 5,942,157 A | 8/1999 | Sutherland |
| 6,069,728 A | 5/2000 | Huignard |
| 2002/0075240 A1 | 6/2002 | Lieberman |
| 2006/0221063 A1 | 10/2006 | Ishihara |
| 2007/0070504 A1 | 3/2007 | Akutsu |
| 2010/0202725 A1* | 8/2010 | Popovich et al. ............... 385/10 |

FOREIGN PATENT DOCUMENTS

| | | |
|---|---|---|
| EP | 1 347 641 A1 | 9/2003 |
| WO | WO 00/23832 A1 | 4/2000 |

(Continued)

OTHER PUBLICATIONS

Sagan S. et al. "Electrically Switchable Bragg Grating Technology for Projection Displays", Proc. SPIE. vol. 4294, Jan. 24, 2001, pp. 75-83.

*Primary Examiner* — William C Dowling
*Assistant Examiner* — Magda Cruz

(57) ABSTRACT

There is provided a projection display device comprising: a light source, an SBG device comprising a multiplicity of separately SBG elements sandwich between transparent substrate to which transparent electrodes have been applied. The substrates function as a light guide. A least one transparent electrode comprises plurality of independently switchable transparent electrodes elements, each electrode element substantially overlaying a unique SBG element. Each SBG element encodes image information to be projected on an image surface. Light coupled into the light guide, undergoes total internal reflection until diffracted out to the light guide by an activated SBG element. The SBG diffracts light out of the light guide to form an image region on an image surface when subjected to an applied voltage via said transparent electrodes.

18 Claims, 6 Drawing Sheets

(56) References Cited

FOREIGN PATENT DOCUMENTS

| WO | PCT/US2004/014124 | 11/2004 |
| WO | PCT/US2006/043938 | 11/2007 |
| WO | PCT/IB2008/0019099 | 1/2009 |
| WO | WO 2009/013597 A2 | 1/2009 |

* cited by examiner

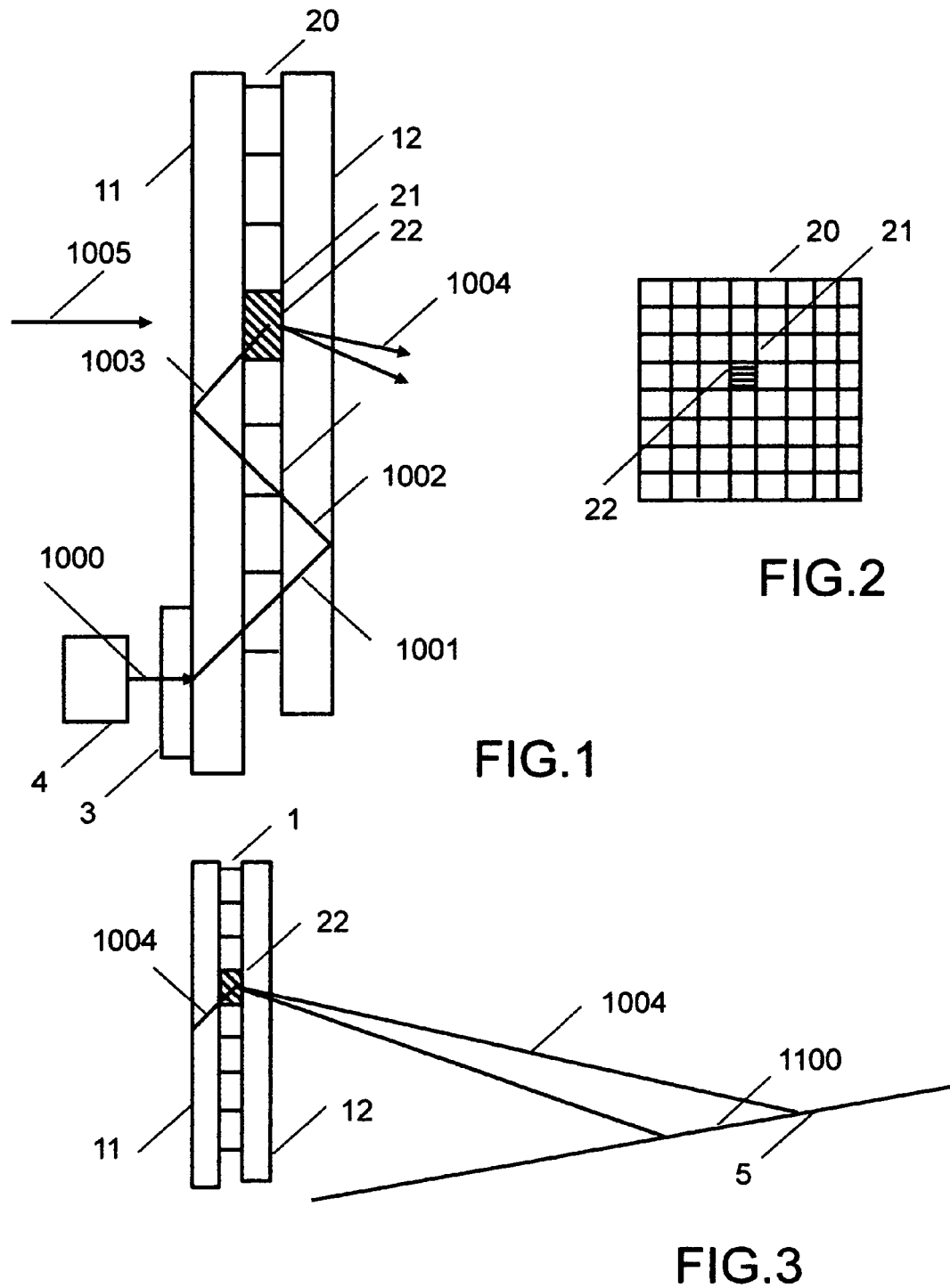

COMPACT EDGE ILLUMINATED DIFFRACTIVE DISPLAY

REFERENCE TO PRIORITY APPLICATION

This application claims the priority of U.S. Provisional Patent Application No. 61/272,601 with filing date 9 Oct. 2009 entitled "Compact edge illuminated diffractive display".

REFERENCE TO EARLIER APPLICATIONS

This application incorporates by reference in their entireties PCT Application No. PCT/US2004/014124 by Popovich et al, entitled "Switchable Viewfinder Display"; PCT Application No PCT/IB2008/001909 by Popovich et al, entitled "Laser Illumination Device"; PCT Application No PCT US2006/043938 by Popovich et al, entitled "Method and Apparatus for Switching a PDLC device" and U.S. Provisional Patent Application No. 61/272,601 with filing date 9 Oct. 2009 entitled "Compact edge illuminated diffractive display".

BACKGROUND OF THE INVENTION

This invention relates to a display device, and more particularly to a compact edge-illuminated projection display based on switchable Bragg gratings.

There is growing consumer demand for projection displays that can be built into mobile devices such as mobile telephones and hand-held computers. However, image sizes and resolutions required for typical applications such as internet browsing or viewing high definition films are already beyond the scope of display technologies currently available for use in mobile devices. New ultra compact projectors known as picoprojectors provide one solution to this problem. Many of the picoprojector designs considered to date rely on conventional flat panel display technologies such as Liquid Crystal Display (LCD) or Digital Light Processor (DLP) technology such as that developed by Texas Instruments (TX). Optical design limits the miniaturization possible with either approach, even when solid state lasers are used as the light source. An alternative approach is to scan the image using micro-optical-electrical-mechanical systems (MOEMS), essentially writing the image using a flying spot. Although MOEMS are much smaller than LCDs or DLPs they present complex opto-mechanical design problems. Very high scanning speeds, resolutions and the tight synchronization of mirror driver and laser modulation are needed in order to deliver high resolution images. Achieving the mechanical robustness required in portable applications is also a challenge. A further problem is that it is also difficult to correct laser speckle in scanned displays.

Desirably, display technologies for portable devices should be very compact with volumes of a few cubic centimeters. A thin form-factor is desirable for ease of integration into devices such as mobile telephones.

There is a requirement for a compact solid-state high-resolution data projection display with a thin form factor.

SUMMARY OF THE INVENTION

It is an object of the present invention to provide compact solid-state high-resolution data projection display with a thin form factor.

A projection display device according to the principles of the invention comprises: a first light source emitting light of a first wavelength; a first SBG device comprising a multiplicity of separately switchable SBG elements disposed in a single layer; transparent substrates sandwiching the SBG device, said substrates together functioning as a first light guide; and a means for coupling the first wavelength light into the first light guide. The first wavelength light undergoes total internal reflection within the first light guide. Transparent electrodes are applied to opposing faces of the substrates. At least one of the transparent electrodes comprises a plurality of independently switchable transparent electrode elements. Each electrode element overlays a unique SBG element. Each SBG element in first SBG device diffracts first wavelength light to form an image region on an image surface when subjected to an applied voltage via the transparent electrodes.

In one embodiment of the invention the image surface is disposed in proximity to the display.

In one embodiment of the invention the image surface is disposed more than 25 centimeters from said display.

In one embodiment of the invention the image surface is disposed more than 50 centimeters from said display.

In one embodiment of the invention one image region comprises an image of a keyboard.

In one embodiment of the invention the image region is an image pixel.

In one embodiment of the invention an SBG element pre-distorts the shape of the image region.

In one embodiment of the invention the image surface is an optical diffusing material.

In one embodiment of the invention the image surface is the retina of an eye.

In one embodiment of the invention the image surface is a curved surface.

In one embodiment of the invention the display further comprises: at least one infrared source; means for directing infrared light from the infrared source towards the image surface and at least one infrared sensor operative to detect light scatter from an object disposed in proximity to the image surface. The infrared source may be a laser. The infrared sensor may comprise an image sensing array and lens.

In one embodiment of the invention the display further comprises: at least one infrared source; means for directing infrared light from the infrared source towards the image surface and at least one infrared sensor operative to detect light scatter from an object disposed in proximity to the image surface. The first SBG device contains at least one infrared diffracting SBG element operative to diffract infrared light from the infrared source towards the image surface when the infrared diffracting SBG element is subjected to an applied voltage via the transparent electrodes.

In one embodiment of the invention that provides full-colour imaging the display further comprises: second and third light sources emitting light of second and third wavelengths; second and third SBG devices each comprising a multiplicity of separately switchable SBG elements disposed in a single layer, the SBG elements of the first second and third SBG devices substantially overlapping each other; transparent substrates sandwiching the second SBG device, said substrates together functioning as a second light guide; transparent substrates sandwiching the third SBG device, said substrates together functioning as a third light guide; and means for coupling the first, second and third wavelength light into the first, second and third light guide. Transparent electrodes are applied to substrate faces in contact with the second and third SBG devices. At least one of the transparent electrodes in contact with the second and third SBG devices comprises a plurality of independently switchable transparent electrodes elements, each of the independently switchable electrodes substantially overlays a unique SBG element. The first, second and third wavelength light undergoes total internal reflection within the light guides, Each element of the second SBG device diffracts second wavelength light to form a second image region on an image surface when subjected to an applied voltage via the transparent electrodes. Each element of the third SBG device diffracts third wavelength light to form a third image region on an image surface when subjected to an applied voltage via the transparent electrodes. The first, second and third image regions substantially overlap.

In one embodiment of the invention that provides full colour imaging SBG elements in the first, second and third wavelength SBG devices are activated in bands. Each band comprises at least one row of SBG elements. Each band is continuously scrolled vertically. At least one band in each of the first, second and third SBG devices is activated at any instant with no overlap occurring between the first, second and third wavelength SBG device bands.

A more complete understanding of the invention can be obtained by considering the following detailed description in conjunction with the accompanying drawings wherein like index numerals indicate like parts. For purposes of clarity details relating to technical material that is known in the technical fields related to the invention have not been described in detail.

BRIEF DESCRIPTION OF THE DRAWINGS

FIG. 1 is a schematic side elevation view of one embodiment of the invention.

FIG. 2 is a schematic front elevation view of a detail of an SBG device in one embodiment of the invention.

FIG. 3 is a schematic side elevation view of one embodiment of the invention.

DETAILED DESCRIPTION OF THE INVENTION

Figure 4:
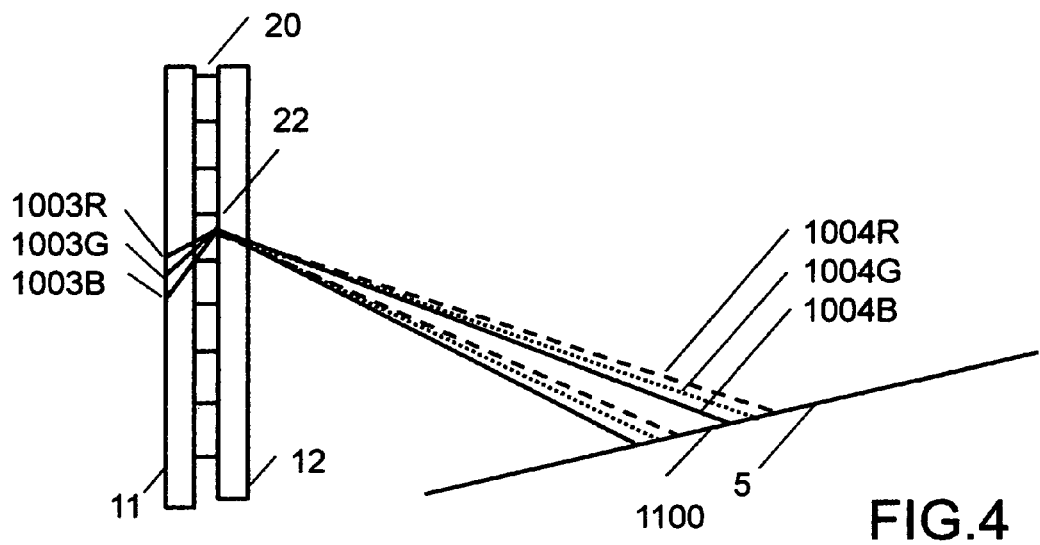
FIG. 4 is a schematic side elevation view of one embodiment of the invention.

It will apparent to those skilled in the art that the present invention may be practiced with some or all of the present invention as disclosed in the following description. For the purposes of explaining the invention well-known features of optical technology known to those skilled in the art of optical design and visual displays have been omitted or simplified in order not to obscure the basic principles of the invention.

Unless otherwise stated the term "on-axis" in relation to a ray or a beam direction refers to propagation parallel to an axis normal to the surfaces of the optical components used in the embodiments of the invention. In the following description the terms light, ray, beam and direction may be used interchangeably and in association with each other to indicate the direction of propagation of light energy along rectilinear trajectories.

Parts of the following description will be presented using terminology commonly employed by those skilled in the art of optical design.

It should also be noted that in the following description of the invention repeated usage of the phrase "in one embodiment" does not necessarily refer to the same embodiment.

The compact projection display disclosed in the present application is based on a diffractive optical device known as a Switchable Bragg Grating (SBG). A SBG is a Bragg grating recorded into a polymer dispersed liquid crystal (PDLC) mixture. Typically, SBG devices are fabricated by first placing a thin film of a mixture of photopolymerizable monomers and liquid crystal material between parallel glass plates. One or both glass plates support electrodes, typically transparent indium tin oxide films, for applying an electric field across the PDLC layer. A Bragg grating is then recorded by illuminating the liquid material with two mutually coherent laser beams, which interfere to form the desired grating structure. During the recording process, the monomers polymerize and the PDLC mixture undergoes a phase separation, creating regions densely populated by liquid crystal micro-droplets, interspersed with regions of clear polymer. The alternating liquid crystal-rich and liquid crystal-depleted regions form the fringe planes of the grating. The resulting Bragg grating can exhibit very high diffraction efficiency, which may be controlled by the magnitude of the electric field applied across the PDLC layer. In the absence of an applied electric field the SBG remains in its diffracting state. When an electric field is applied to the hologram via the electrodes, the natural orientation of the LC droplets is changed thus reducing the refractive index modulation of the fringes and causing the hologram diffraction efficiency to drop to very low levels. The diffraction efficiency of the device can be adjusted, by means of the applied voltage, over a continuous range from essentially zero to near 100%. U.S. Pat. No. 5,942,157 by Sutherland et al. and U.S. Pat. No. 5,751,452 by Tanaka et al. describe monomer and liquid crystal material combinations suitable for fabricating ESBG devices.

In one embodiment of the invention illustrated in the schematic side elevation view of FIG. 1 there is provided an SBG array device comprising a pair of transparent substrates 11 and 12 and an SBG layer 20 sandwiched between the substrates. The two substrates 11 and 12 together form a light guide. The SBG layer comprises an array of individually switchable SBG elements. As will be discussed below the SBG elements may be switched using a range of spatiotemporal switching schemes, including any of the active matrix switching regimes used in conventional flat panel displays. Typically the substrates will be fabricated from optical glass such as BK7 or a high quality optical plastic.

Transparent electrodes, which are not shown in FIG. 1, are applied to both of the inner surfaces of the substrates and electrically coupled to a voltage generator (not illustrated). The electrodes are configured such that the applied electric field will be perpendicular to the substrates. Typically, the planar electrode configuration requires low voltages, in the range of 2 to 4 volts per μm. The electrodes would typically be fabricated from Indium Tin Oxide (ITO). Commercially available ITO typically has a coating resistance of typically 300-500 Ohm/sq. An exemplary ITO film used by the inventors is the N00X0325 film manufactured by Applied Films Corporation (Colorado). Typically, ITO films used with the present invention have a thickness of 100 Angstrom.

In one embodiment of the invention the electrode on one substrate surface is uniform and continuous, while the electrode on the opposing substrate surface is patterned to match the shapes of the SBG elements. In an alternative embodiment of the invention the electrodes may be identically patterned such that each SBG element is sandwiched by identical electrodes matching the shape of the SBG element. Desirably, the planar electrodes should be exactly aligned with the SBG elements for optimal switching of the symbols and the elimination of any image artefacts that may result from unswitched grating regions.

In practice the SBG elements will separated by very narrow grating-free regions which are essentially homogenous regions of PDLC that generally do not respond to applied electric fields. Such grating-free regions normally result from masking during fabrication of the SBG device. Techniques for overcoming problems associated with such gaps are disclosed in PCT Application No PCT US2006/043938 by Popovich et al, entitled "Method and Apparatus for Switching a PDLC device", which is incorporated by reference herein in its entirety, may be used with the present invention. In most applications of the invention the effects on image quality of such gaps between SBG elements are not likely to be significant.

An SBG contains slanted fringes resulting from alternating liquid crystal rich regions and polymer rich (i.e. liquid crystal depleted) regions. SBGs may be configured to be transmissive or reflective according to the slant of the fringes. Reflection SBGs are characterized by fringes that are substantially parallel to the substrates. For the purposes of explaining the invention transmissive SBGs will be assumed in the following description. However, it should be clear that any of the embodiments of the invention may be practiced using either reflective or transmissive SBGs. With no electric field applied, the extraordinary axis of the liquid crystals generally aligns normal to the fringes. The grating thus exhibits high refractive index modulation and high diffraction efficiency for P-polarized light. When an electric field is applied to the SBG, the extraordinary axes of the liquid crystal molecules align parallel to the applied field and hence perpendicular to the substrate. Note that the electric field due to the planar electrodes is perpendicular to the substrate. In this state the grating exhibits lower refractive index modulation and lower diffraction efficiency for both S- and P-polarized light. Thus the grating region no longer diffracts light but rather acts like a transparent plate have little effect on incident light other than a small amount of absorption, scatter and Fresnel reflection loss at the grating-substrate interfaces.

The operation of a compact projection display according to the principles of the invention may be understood with reference to FIGS. 1-3. FIG. 2 shows a front elevation view of the SBG array. FIG. 3 shows a side elevation view of the display. We consider the case in which one SBG element 22 is in its active or diffracting state and all other SBG elements such as the one indicated by 21 are in their passive or non diffracting states. Input light 1000 from a source 4 is optically coupled to the substrates 11 and 12 via an optical coupling device 3. Light admitted into the light guide undergoes TIR between the outer surfaces of the substrates 11,12. Advantageously, the source is a solid state laser. Alternatively, the source may be a Light Emitting Diode (LED). However the broader spectral bandwidth of LEDs will result in some chromatic dispersion at the SBG elements. The coupling device may be a prism or a grating. The invention does not assume any particular method for coupling light into the substrates. However, a method based on a grating is highly desirable from the perspective of minimizing the thickness of the display. To overcome laser speckle the display would advantageously also incorporate a despeckler such as the one disclosed in the PCT application PCT/IB2008/0019099 with International Filing date 22 Jul. 2008 entitled "LASER ILLUMINATION DEVICES" which is incorporated by reference herein in its entirety. The invention may be applied with any other type of despeckler but preferably one based on solid state technology.

The input light 1000 is deflected into the ray direction 1001 by the coupling device 3. The deflection angle in the substrates should exceed the critical angle for the substrate medium to air interface. The ray now follows a TIR path constrained by the outer surfaces of the light guide provided by the substrates. Hence, the ray 1001 is totally internally reflected into the ray path indicated by 1001,1002,1003.

The grating in each SBG element encodes wave-front amplitude and phase modulation information such that that incident TIR light is diffracted to form a focussed image region of predefined geometry and luminance distribution at the image surface 5. The light 1003 which impinges on the active SBG element 22 is diffracted towards the image surface 5 as the beam 1004. As indicated in FIG. 3, the diffracted light 1004 forms an image 1100 at the image surface 5. Light which does not impinge on the SBG element will hit the substrate-air interface at the critical angle and is therefore totally internally reflected and eventually collected at a beam stop, which is not illustrated. The invention does not assume any particular method for trapping non diffracted light.

The image surface 5 may a diffusing surface of any geometry and as indicated in FIG. 3 may be tilted with respect to the display. In typical applications of the invention the image surface will be a plane. The image surface will most typically will be either parallel to or orthogonal to the grating plane. The image is formed without the need for an additional lens or any other optical element between the SBG array and the surface. Another important feature of the invention is that, since the SBG array elements each contain diffraction patterns, the resolution of the final projected images is much higher than the resolution of the array. The side elevation view of the display of FIG. 1 in which the source and coupling optics are omitted shows the formation of an image element 1100 on the surface 5 by the SBG element 22.

In one embodiment of the invention the image element may be a rectangular pixel having a luminance level determined by the voltage applied across the SBG element. By applying voltages to each SBG in the SBG array a pixelated image is provided over a predefined image area. An SBG element may be designed to provide pre-distortion of the image element geometry to compensate for the effects of off axis projection, such as key-stoning. The invention is not necessarily limited to pixelated display applications. In one embodiment of the invention the image element formed by a SBG element may have an intensity distribution within a predefined area. As will be explained below such an embodiment may be used to provide structured illumination for a range of applications.

The techniques for encoding such optical functions into an SBG are well know to those skilled in the design of Holographic Optical Elements (HOEs) and Diffractive Optical Elements (DOEs). The invention does not rely on any particular method of encoding optical functions into SBGs. Advantageously the SBG element is fabricated by first designing and fabricating a Computer Generated Hologram (CGH) with the required optical properties and then recording the CGH into the ESBG element. The above process is equivalent to forming a hologram of the CGH. The invention does not rely on any particular method for recording the CGH into the SBG. Any holographic recording techniques known to those skilled in the art of holography may be used. It should be noted that the resulting SBG element is not identical in every respect to the CGH since properties of a CGH rely on its surface phase relief features while the optical characteristics of a Bragg grating such as an SBG rely on a complex three dimensional fringe distribution.

It should be clear from consideration of FIGS. 1-3 that a display according to the principles of the invention will be transparent to external ambient light such as the light 1005 indicated in FIG. 1. Since the external light is broadband and incident over a wide range of angles only a small portion of it will be lost due to diffraction at active SBG elements. In other words only a very small portion of the external light will have incidence angles and wavelengths that satisfy the Bragg condition at the active SBG elements. The external light will also suffer small transmission loss due to Fresnel reflections, scatter and absorption.

Typically, the image surface is disposed between 25-100 centimeters from the display. However, the distances may be much greater depending one the application and the image brightness requirements. In certain embodiments of the invention the image surface may be very close to the display. In such embodiments the image and image surface may be integrated within a directly viewable display module. However, such embodiments will sacrifice the image magnifications obtained by projecting the image over a longer distance.

Figure 5:
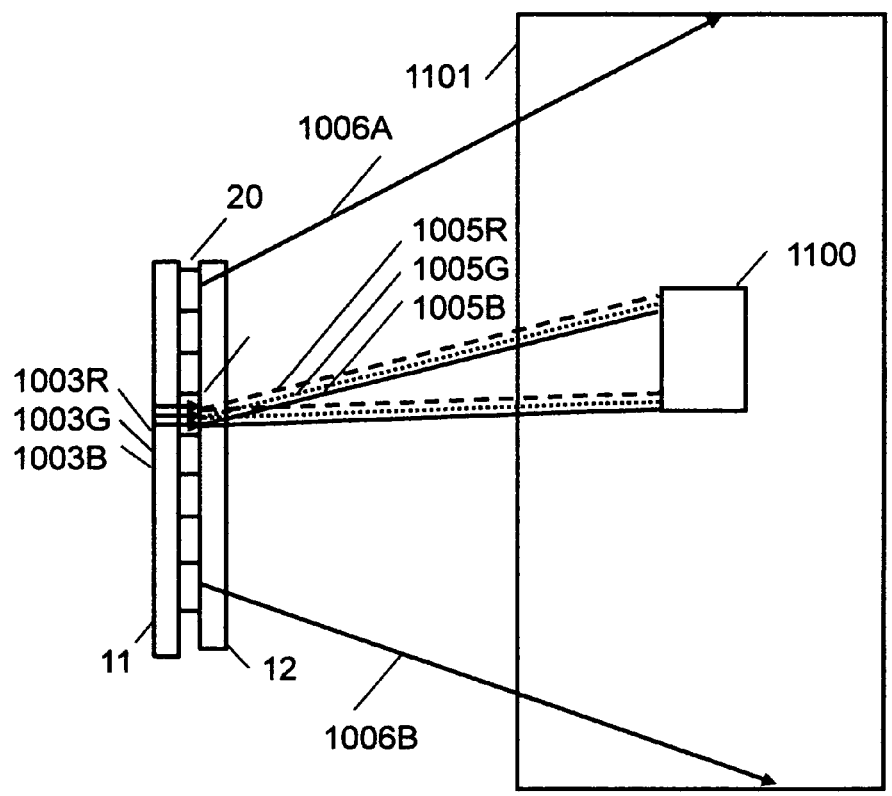
FIG. 5 is a schematic plan view of the embodiment of the invention illustrated in FIG. 4.

In one embodiment of the invention based on the embodiment illustrated in FIGS. 1-3 there is provided a colour projection display. The basic principles of the colour display are illustrated in FIGS. 4-5. Light from separate red green and blue sources is coupled into the light-guide formed by the substrates 11,12. Again the coupling optics, which are not illustrated, may comprise prisms or diffractive elements. Many alternative methods of coupling light from different colour sources into a light guide will be known to those skilled in the art. Desirably, the coupling optics are based on diffractive optical techniques to keep the display as thin as possible. The TIR angle for each colour is constrained such that the incidence angle for a particular colour light at a given SBG satisfy the Bragg condition for diffraction at a specified diffraction angle. The red, green, blue light is presented sequentially. As indicated in the schematic side elevation view of FIG. 4, incident red, green, blue TIR rays 1003R, 1003G,1003B at the SBG 22 are diffracted into the red, green, blue image light indicated by 1004R,1004G,1004B towards the image surface 5 forming the colour image element 1100. FIG. 5 shows a plan view of the display showing the a plan view of the diffracted beams indicated by 1005R,1005G, 1005B. The lateral extent of the projected beam is indicated by the rays 1006A, 1006B. Note that in FIGS. 4-5 the separation of the beams has been exaggerated for the purposes of explanation.

Figure 6:
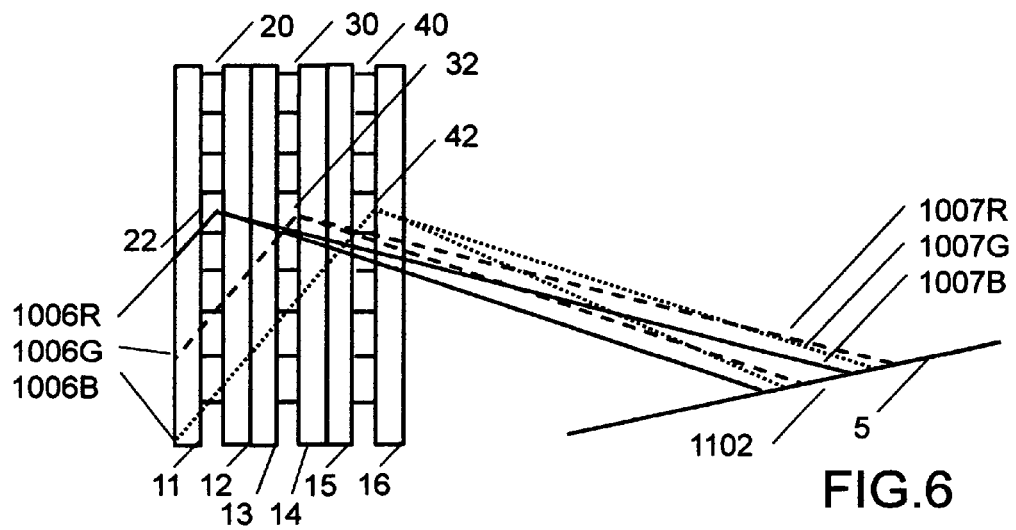
FIG. 6 is a schematic side elevation view of one embodiment of the invention.

Colour imaging may also be provided by stacking red, green, and blue SBG arrays of the type illustrated in FIGS. 1-3 and providing illumination from red, green and blue light sources. Such embodiments of the invention will suffer from the problems of alignment and light transmission loss. In the embodiment of the invention illustrated in the schematic side elevation view of FIG. 6 there are provided red, green and blue diffracting SBG arrays 20,30,40. The SBG arrays are sandwiched between substrates 11,12,13,14,15,16. The substrates are stacked to form a single light guiding structure. Light from separate red, green and blue sources is coupled into the light-guide. Again the preferred coupling optics are based on diffractive optical techniques to keep the display as thin as possible. Since a separate SBG arrays is provided for each colour, the TIR angle may be the same for each colour. The red, green, blue light is presented simultaneously. Referring to FIG. 6 incident red, green and blue light 1006R, 1006G,1006B at the active red, green, blue SBG elements 22,32,42 is diffracted into the beams 1007R,1007G,1007B forming a colour image element 1102 at the image surface 5. Note that the separation of the beams has again been exaggerated for the purposes of explanation.

In one embodiment of the invention the SBG elements may be switched using a switching scheme commonly referred to as "scrolling". Conventional colour displays rely on providing a single display panel that is updated with red, green and blue picture information in turn and sequentially fully illuminated by red, green and blue illumination. Alternatively, three panel architectures provide seperate red, green and blue image panels which are separately fully illuminated by red, green and blue light. Such displays suffer from the problems of having to update the entire red, green or blue images before illumination of the appropriate colour can be applied. In the case of three-panel displays the cost of the display may become prohibitive. A single panel scrolling color projection display system is characterized by a single light modulator panel having a raster of individual picture elements or pixels, which panel is illuminated by horizontally elongated red, green and blue illumination bars or stripes. The stripes are continuously scrolled vertically across the panel while the rows of pixels are synchronously addressed with display information corresponding to the color of the then incident stripe. The modulated scrolling red, green and blue stripes are then projected onto a display screen to produce a visually integrated full color display. Exemplary scrolling displays are disclosed in U.S. Pat. No. 5,410,370, entitled "Single panel color projection video display improved scanning" issued to P. Janssen on Mar. 25, 1994, and U.S. Pat. No. 5,416,514, entitled "Single panel color projection video display having control circuitry for synchronizing the color illumination system with reading/writing of the light valve" issued to P. Janssen et al. on May 16, 1995.

Figure 7:
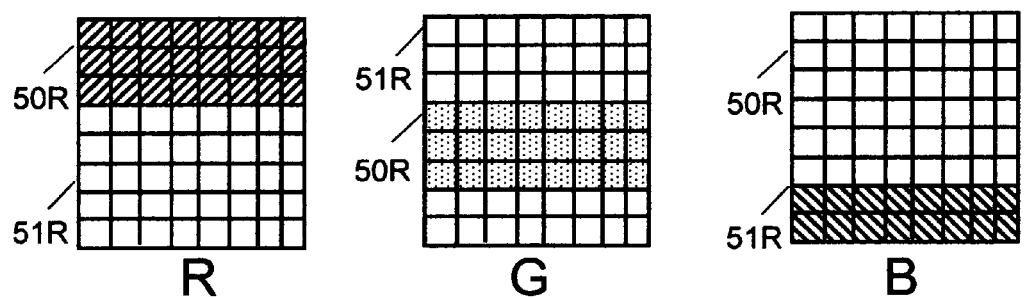
FIG. 7 is a schematic front elevation view of a scrolling SBG device in one embodiment of the invention.

The principles of scrolling may be applied in the present invention by switching rows of SBG elements in sequence. A basic scrolling scheme for use with the present invention is illustrated in FIG. 7. The scrolling scheme may be implemented using the embodiment of FIG. 6. In each SBG device SBG elements are activated in bands comprising at least one row of SBG elements. The bands are continuously scrolled vertically, at least one band in each of the red green and blue SBG devices being activated at any instant, said bands in said first, second and third SBG devices not overlapping. FIG. 7 shows red, green and blue states indicated by symbols R,G,B at one instant in time. In each case, the diffracting rows or bands of SBG elements are shaded. Thus red SBG band 50R, green SBG band 50G and blue SBG band 50B are diffracting while red SBG pixel rows 51R, green SBG pixel rows 51G and blue SBG pixel rows 51B are not diffracting permitting TIR to proceed.

Figure 8:
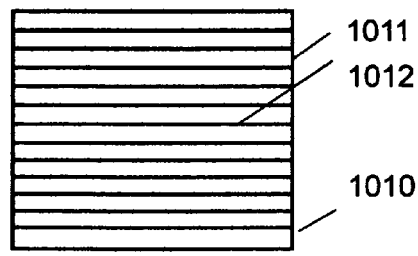
FIG. 8 is a front elevation view of structured illumination provided by one embodiment of the invention.
Figure 9:
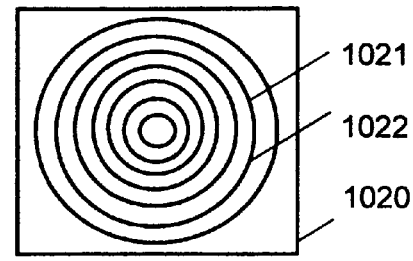
FIG. 9 is a front elevation view of structured illumination provided by one embodiment of the invention.

In a particular group of embodiments of the invention at least one SBG array element in any of the above described embodiments may provide structured infrared illumination using light from an infra red source. The infrared light would be injected into the light guide formed by the substrates in a similar fashion to the means used to introduce visible light in any of the above embodiments. The infrared source is typically a 780 nm laser. However other near-infrared sources may be used. The structure lighting may comprise parallel bars, concentric circles and other geometrical structures commonly used in the visualization and measurement of three-dimensional shapes. Examples of structures infrared lighting are provided in FIGS. 8-9. In the example shown in FIG. 8 the structured lighting 1010 comprises parallel bars and spaces 1011,1012. In the example shown in FIG. 9 the structure lighting 1020 comprises concentric circles 1021 separated by gaps 1022.

Figure 10:
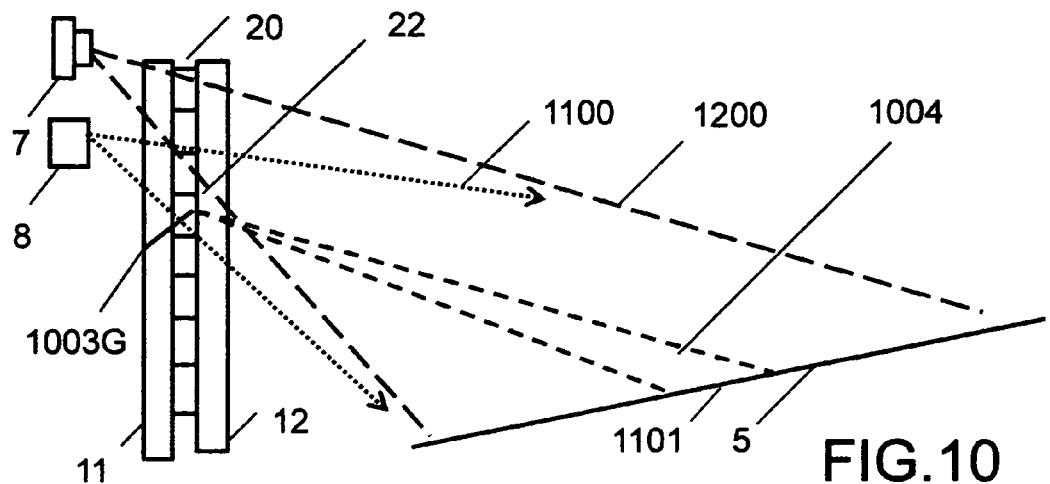
FIG. 10 is a schematic side elevation view of one embodiment of the invention incorporating an infrared source and infrared detector.
Figure 11:
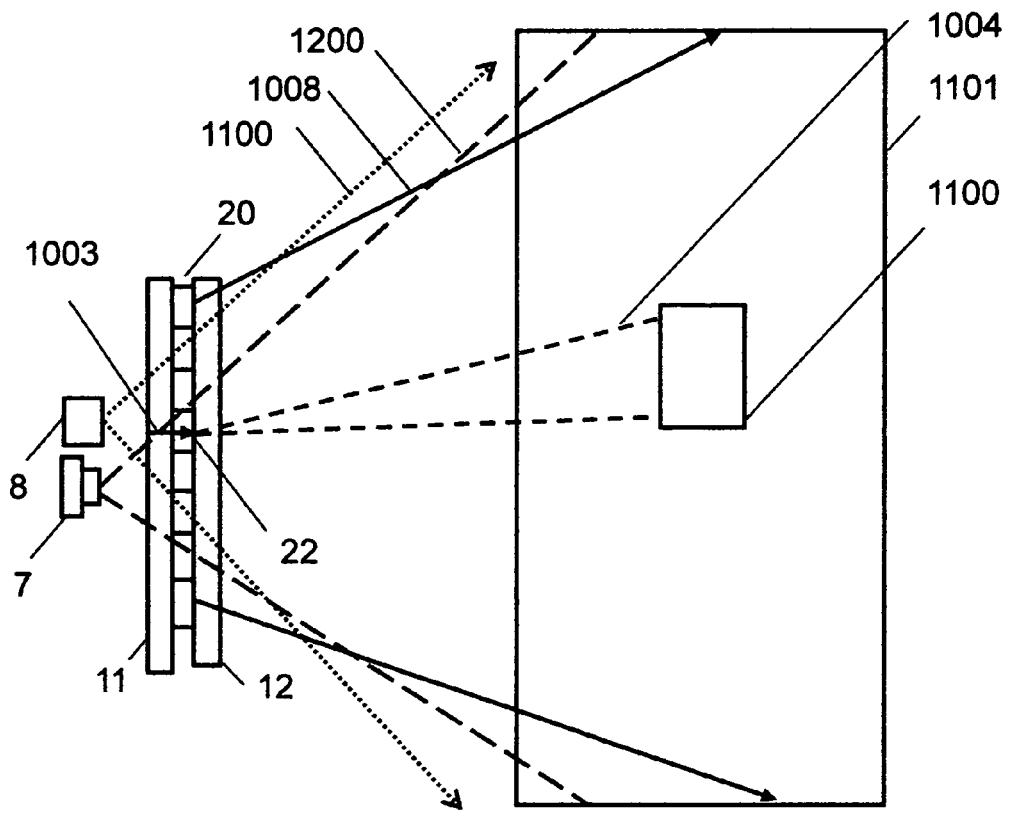
FIG. 11 is a schematic plan view of one embodiment of the invention incorporating an infrared source and an infrared detector.

FIGS. 10-11 show an embodiment similar to the one of FIGS. 4-5 in which there is further provided at least one infrared sensor such as 7 and at least one infrared source such as 8. Advantageously, the sensor is a two dimensional infrared array. The infrared source illuminates the image surface 5 with the infrared beam indicated by 1100. The infrared sensor detects backscattered light from objects within a field of view indicated by 1200. The sensor is coupled to a processor which is in turn coupled to an image processor which is not illustrated. The optical system is illustrated in plan view in FIG. 11. Since the display is transparent one or both of the infrared sensor or source may be displayed on the opposite site of the display to the image surface as indicated in FIGS. 10-11. Alternatively, one or both of the infrared sensor or source may be disposed around the periphery of the display. In one embodiment of the invention a structured light pattern based on the ones illustrated in FIGS. 8-9 may be encoded within the SBG element. Alternatively, other structured lighting patterns may be used.

Figure 12:
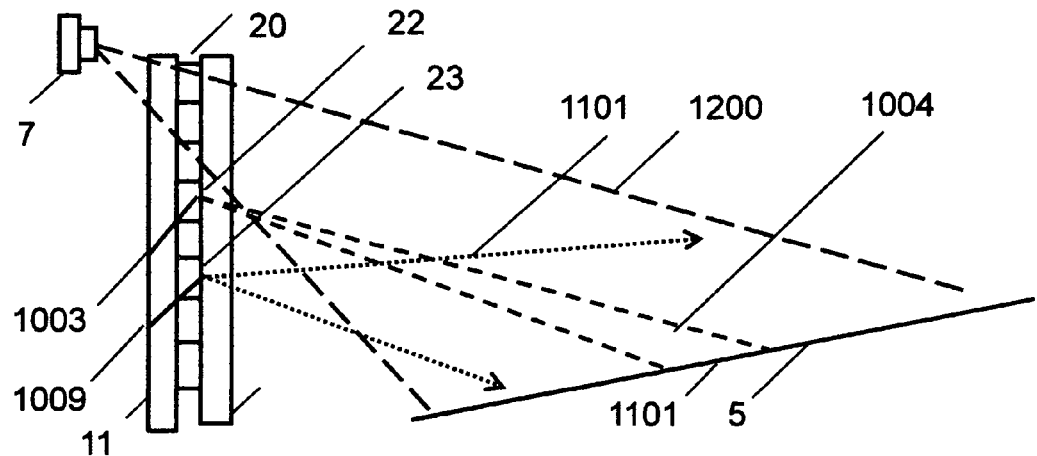
FIG. 12 is a schematic side elevation view of one embodiment of the invention incorporating an infrared source and an infrared detector.
Figure 13:
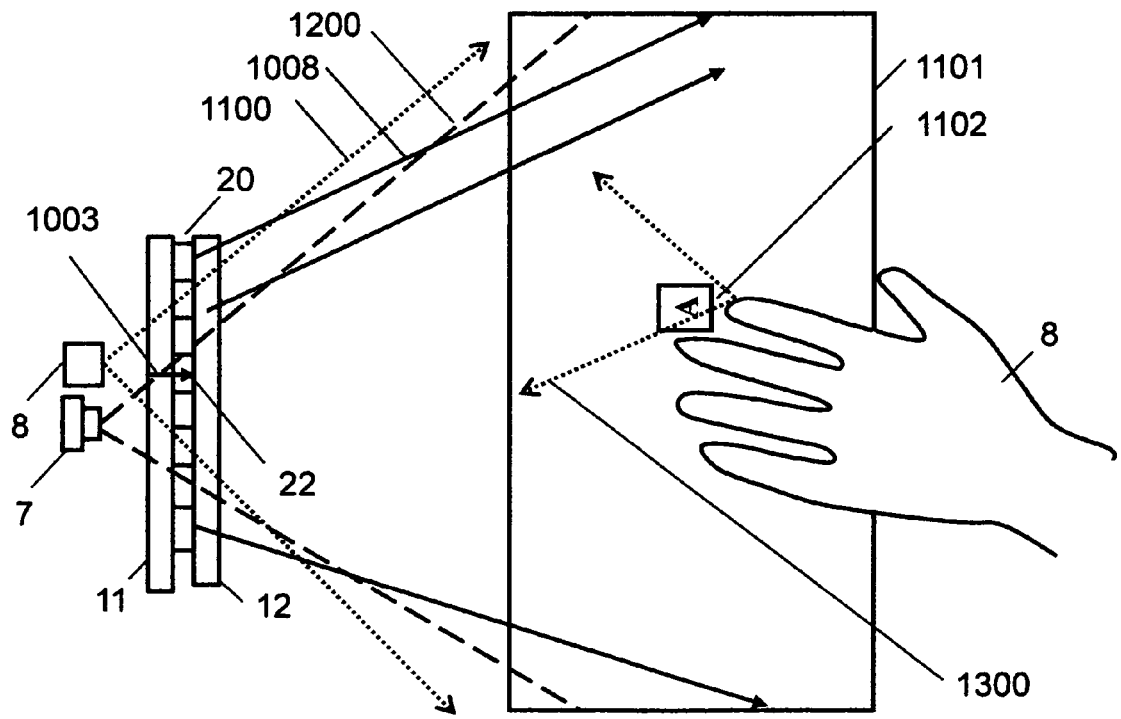
FIG. 13 is a schematic plan view of an embodiment of the invention that provides a virtual keyboard.

In one embodiment of the invention illustrated in the schematic side elevation view of FIG. 12 the infrared source may be coupled via the light guide to one or more dedicated SBG arrays elements contained in the SBG array. Totally internally reflected infrared light infrared light 1009 incident on an active infrared diffracted diffracting SBG element 23 is diffracted to provide the divergent infrared light beam 1101. In one embodiment of the invention a structured light pattern based one the ones illustrated in FIGS. 8-9 may be encoded within the SBG element. Alternatively, other structured lighting patterns may be used. In one embodiment of the invention more than one infrared diffracting SBG similar to the element 23 may be provided for the purpose of determining object range by triangulation. Such an implementation of the invention may be used to provide the instantaneous location of an object near the image surface. The invention does not rely on particular method for determining range from triangulation or determined the shape of an object using structured light. Tracking algorithms which are designed to determine the range or shape of an object by analyzing changes in sequential image frames recorded by a single sensor may also be used with the invention.

Figure 14:
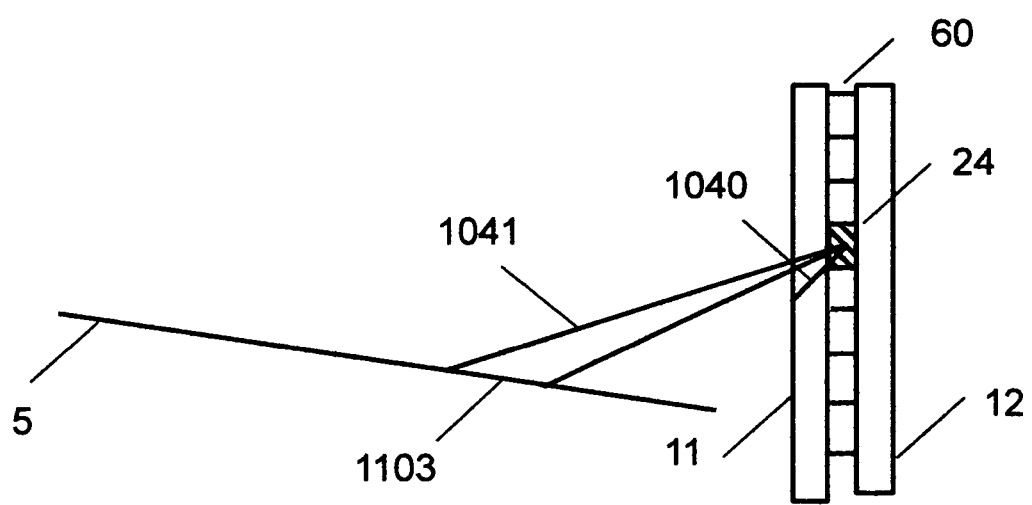
FIG. 14 is a schematic side elevation vies of an embodiment of the invention that uses reflective SBGs.

It will be clear from consideration of the above description that the invention may be used to provide more than one viewable image. In one embodiment of the invention based on the embodiments of FIGS. 10-12 there is provided a virtual computer keyboard projected by a single SBG element. The other SBG elements are used to project a live image, in other words an image that is updated on a frame-by-frame basis. One key with symbol A is indicated by 1102. The infrared sensor 7 detects infrared light 1300 scattered from a finger 81 of the hand 8. An image processing system (not illustrated) determines whether the proximity of the finger to the key is sufficiently close for a key strike to have occurred. In other embodiments of the invention more than one SBG element may be used to project elements of the keyboard onto the image surface The SGB arrays in any of the above described embodiments of the invention may use SBG elements configured as wither transmissive or reflective gratings. In the embodiment illustrated in the schematic side elevation view of FIG. 14 the SBG device 60 is based on reflection gratings. TIR light indicated by 1040 is reflected by the active SBG element 24 of the SBG device into the beam 1041 towards the image surface 51 forming the image 1103.

The SGB arrays in any of the above described embodiments of the invention may incorporate SBG elements designed to diffract thermal infra red radiation.

The SGB arrays in any of the above described embodiments of the invention may incorporate SBG elements designed to diffract ultraviolet radiation.

In one embodiment of the invention the image surface is the retina of the human eye.

Although the invention has been described in relation to what are presently considered to be the most practical and preferred embodiments, it is to be understood that the invention is not limited to the disclosed arrangements but rather is intended to cover various modifications and equivalent constructions included within the spirit and scope of the invention.

What is claimed is:

1. A projection display for projecting image light onto an image surface, said display comprising:
   a first light source emitting light of a first wavelength;
   a first SBG array comprising a multiplicity of separately switchable SBG elements disposed in a single layer;
   transparent substrates sandwiching said SBG array, said substrates together functioning as a first light guide;
   transparent electrodes applied to opposing faces of said substrates, at least one of said transparent electrodes comprising a plurality of independently switchable transparent electrode elements, each of said independently switchable electrode elements substantially overlaying a unique SBG element;
   a means for coupling said first wavelength light into said first light guide, said first wavelength light undergoing total internal reflection within said first light guide;
   each said SBG element having a diffracting state and a non diffracting state;
   characterized in that each said SBG element when in its diffracting state diffracts said first wavelength light to form a focused image region of predefined geometry and luminance distribution on said image surface,
   wherein said SBG element encodes wavefront and phase information corresponding to said geometry and said luminance distribution.

2. The projection display of claim 1 wherein said diffracting state exists when no electric field is a applied across said SBG element via said transparent electrodes and said non diffracting state exists when an electric field is applied across said SBG element via said transparent electrodes.

3. The projection display of claim 1 wherein the image surface is disposed in proximity to said display.

4. The projection display of claim 1 wherein the image surface is more than 50 centimeters from said display.

5. The projection display of claim 1 wherein one said image region comprises an image of a keyboard.

6. The projection display of claim 1 wherein said image region is an image pixel.

7. The projection display of claim 1 wherein said SBG elements pre-distort the shape of said image region.

8. The projection display of claim 1 wherein image surface is a diffusing material.

9. The projection display of claim 1 wherein image surface is the retina of an eye.

10. The projection display of claim 1 wherein said image surface is curved.

11. The projection display of claim 1 further comprising: at least one infrared source; means for directing infrared light from said source towards said image surface and at least one infrared sensor operative to detect light scattered from an object disposed in proximity to said image surface.

12. The projection display of claim 11 wherein said infrared source is a laser.

13. The projection display of claim 11 wherein said infrared sensor comprises an image sensing array and lens.

14. The projection display of claim 11 wherein said first SBG array contains at least one infrared diffracting SBG element operative to diffract infrared light from said infrared source towards said image surface when said infrared diffracting SBG element is subjected to an applied voltage via said transparent electrodes.

15. The projection display of claim 1 further comprising:
second and third light sources emitting light of second and third wavelengths;
second and third SBG arrays each comprising a multiplicity of separately switchable SBG elements disposed in a single layer; said SBG elements of said first, second and third SBG arrays substantially overlapping;
transparent substrates sandwiching said second SBG array, said substrates together functioning as a second light guide;
transparent substrates sandwiching said third SBG array, said substrates together functioning as a third light guide;
transparent electrodes applied to substrate faces in contact with said second and third SBG arrays, at least one of said transparent electrodes in contact with said second and third SBG arrays comprising a plurality of independently switchable transparent electrodes elements, each of said independently switchable electrodes substantially overlaying a unique SBG element;
means for coupling said first, second and third wavelength light into said first, second and third light guides, said first, second and third wavelength light undergoing total internal reflection within said light guides,
each element of said second SBG array diffracting said second wavelength light to form a second image region on an image surface when subjected to an applied voltage via said transparent electrodes, each said element of said second SBG array when in its diffracting state diffracting said second wavelength light to form a focused image region of predefined geometry and luminance distribution on said image surface,
wherein said element of said second SBG array encodes wavefront and phase information corresponding to said geometry and said luminance distribution,
each element of said third SBG array diffracting said third wavelength light to form a third image region on an image surface when subjected to an applied voltage via said transparent electrodes, each said element of said third SBG array when in its diffracting state diffracting said third wavelength light to form a focused image region of predefined geometry and luminance distribution on said image surface,
wherein said element of said third SBG array encodes wavefront and phase information corresponding to said geometry and said luminance distribution.

16. The projection display of claim 15 wherein said first, second and third image regions substantially overlap.

17. The projection display of claim 15 wherein in each said first, second and third wavelength SBG array said SBG elements are configured in rows and columns of a rectangular array and are switched sequentially into their diffracting states in bands comprising at least one row of SBG elements, wherein at least one band of SBG elements in each of said first, second and third SBG arrays is activated at any instant, wherein no overlap exists between said first, second and third wavelength SBG array bands.

18. The projection display of claim 1 wherein the image surface is more than 25 centimeters from said display.

* * * * *